(12) United States Patent
Li et al.

(10) Patent No.: US 11,761,824 B2
(45) Date of Patent: Sep. 19, 2023

(54) TEMPERATURE SENSING SYSTEM

(71) Applicant: Shanghai Zhaoxin Semiconductor Co., Ltd., Shanghai (CN)

(72) Inventors: Shen Li, Beijing (CN); Zhongding Liu, Beijing (CN)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 320 days.

(21) Appl. No.: 17/084,997

(22) Filed: Oct. 30, 2020

(65) Prior Publication Data

US 2022/0099500 A1 Mar. 31, 2022

(30) Foreign Application Priority Data

Sep. 30, 2020 (CN) .......................... 202011054214.9

(51) Int. Cl.
| | |
|---|---|
| *G01K 3/14* | (2006.01) |
| *G01K 7/01* | (2006.01) |
| *G01K 1/02* | (2021.01) |
| *G01K 7/00* | (2006.01) |
| *G01K 7/22* | (2006.01) |
| *H03M 1/12* | (2006.01) |

(52) U.S. Cl.
CPC .............. *G01K 3/14* (2013.01); *G01K 1/026* (2013.01); *G01K 7/01* (2013.01); *G01K 7/00* (2013.01); *G01K 7/22* (2013.01); *H03M 1/12* (2013.01)

(58) Field of Classification Search
CPC ............ G01K 3/14; G01K 1/026; G01K 7/01; G01K 7/00; G01K 7/22; H03M 1/12
See application file for complete search history.

(56) References Cited

U.S. PATENT DOCUMENTS

| | | | | |
|---|---|---|---|---|
| 6,736,540 B1 * | 5/2004 | Sheehan | .................. | G01K 7/01 |
| | | | | 374/178 |
| 7,252,432 B1 * | 8/2007 | Henderson | ............. | G01K 1/026 |
| | | | | 374/E1.005 |

(Continued)

FOREIGN PATENT DOCUMENTS

| | | |
|---|---|---|
| CN | 1773230 A | 5/2006 |
| CN | 111157133 A | 5/2020 |

OTHER PUBLICATIONS

Chinese language office action dated Jun. 2, 2022, issued in application No. CN 202011054214.9.

(Continued)

*Primary Examiner* — Nathaniel T Woodward
*Assistant Examiner* — Philip L Cotey
(74) *Attorney, Agent, or Firm* — McClure, Qualey & Rodack, LLP

(57) ABSTRACT

A temperature sensing system with simplified wiring comprises an in-core temperature sensing component and an out-of-core temperature-evaluation device. The out-of-core temperature-evaluation device provides a plurality of currents to the in-core temperature sensing module in a time-sharing manner. Corresponding to the plurality of currents, the in-core temperature sensing component generates a plurality of potentials to the out-of-core temperature-evaluation device. The out-of-core temperature-evaluation device evaluates a temperature data by performing a difference calculation on the plurality of potentials.

10 Claims, 4 Drawing Sheets

(56) References Cited

U.S. PATENT DOCUMENTS

| | | | | |
|---|---|---|---|---|
| 10,352,775 B2* | 7/2019 | Pan | ................ | G01K 7/01 |
| 2006/0039445 A1* | 2/2006 | McLeod | ................ | G01K 7/00 |
| | | | | 374/178 |
| 2007/0115042 A1* | 5/2007 | McLeod | ................ | G01K 7/01 |
| | | | | 327/512 |
| 2010/0040111 A1* | 2/2010 | Cheng | ................ | G01K 7/01 |
| | | | | 374/170 |
| 2010/0161261 A1* | 6/2010 | Drapkin | ................ | G01K 7/01 |
| | | | | 702/65 |
| 2011/0158286 A1* | 6/2011 | Peterson | ................ | G01K 7/01 |
| | | | | 374/170 |
| 2013/0195142 A1* | 8/2013 | Peng | ................ | G01K 7/01 |
| | | | | 307/115 |
| 2013/0301680 A1* | 11/2013 | Qiu | ................ | G01K 7/01 |
| | | | | 374/E1.001 |
| 2016/0003683 A1* | 1/2016 | Leow | ................ | G01K 7/01 |
| | | | | 702/130 |
| 2016/0047696 A1* | 2/2016 | Ramaraju | ................ | G01K 7/01 |
| | | | | 374/170 |
| 2017/0089766 A1* | 3/2017 | Pan | ................ | G01K 3/06 |
| 2017/0328790 A1* | 11/2017 | Bach | ................ | G01K 15/002 |
| 2019/0339134 A1* | 11/2019 | Pan | ................ | G01K 3/06 |

OTHER PUBLICATIONS

CN Office Action dated Nov. 22, 2022 in Chinese application No. 202011054214.9.

* cited by examiner

TEMPERATURE SENSING SYSTEM

CROSS REFERENCE TO RELATED APPLICATIONS

This application claims the benefit of China Patent Applications No. 202011054214.9 filed on Sep. 30, 2020, the entirety of which is incorporated by reference herein.

BACKGROUND OF THE INVENTION

Field of the Invention

The present invention relates to a temperature sensing system for sensing the internal temperature of a computing core.

Description of the Related Art

The temperature within a computing core will obviously affect the computing performance of the computing core. It's important to sense the temperature within the computing core. Generally, if the core temperature is too high, the arithmetic unit should perform a downclocking operation to guarantee computing reliability. For monitoring temperature variation in time, a temperature sensing system is required for a computing core(s) of a chip.

With the development of semiconductors, a chip may include multiple computing cores. If each computing core is equipped with an exclusive temperature sensing system, the chip size will be considerable and the wiring will be very complicated.

A small temperature sensing system with low wiring complexity is an urgently needed project in the technical field.

BRIEF SUMMARY OF THE INVENTION

A temperature sensing system in accordance with an exemplary embodiment of the present invention includes an in-core temperature sensing component and an out-of-core temperature-evaluation device. The in-core temperature sensing component receives a plurality of currents in a time-sharing manner and thereby generates a plurality of potentials. Wherein, the in-core temperature sensing component outputs the plurality of currents to an in-core ground. The out-of-core temperature-evaluation device is coupled to the in-core temperature sensing component to provide the plurality of currents. The out-of-core temperature-evaluation device receives the plurality of potentials to calculate a difference potential, and then evaluates a temperature data according to the difference potential. The out-of-core temperature-evaluation device is grounded to the out-of-core ground. Herein, the plurality of currents provided by the out-of-core temperature-evaluation device do not need to flow out the computing core. Thus, the circuit wiring is simple. As for the problem of the voltage difference between the in-core ground and the out-of-core ground can be solved by the difference calculation.

In an exemplary embodiment, the temperature sensing system includes a circuit trace transferring the currents from the out-of-core temperature-evaluation device to the in-core temperature sensing component. The out-of-core temperature-evaluation device includes an analog-to-digital converter. The analog-to-digital converter is coupled to the circuit trace to receive the plurality of potentials and convert the plurality of potentials from analogue to digital.

In an exemplary embodiment, the in-core temperature sensing component and the out-of-core temperature-evaluation device are connected through just the circuit trace. The out-of-core temperature-evaluation device provides a first current and a second current to the in-core temperature sensing component in the time-sharing manner. The second current is N times of the first current, wherein N is a value greater than 1. Corresponding to the first current, the analog-to-digital converter generates a first digital potential. Corresponding to the second current, the analog-to-digital converter generates a second digital potential. The out-of-core temperature-evaluation device evaluates the temperature data based on the value N and the difference between the second digital potential and the first digital potential.

In another exemplary embodiment using just one circuit trace to connect the in-core temperature sensing component and the out-of-core temperature-evaluation device, The out-of-core temperature-evaluation device provides a first current, a second current and a third current to the in-core temperature sensing component in the time-sharing manner. The third current is N times of the second current, and the second current is N times of the first current, wherein N is a value greater than 1. Corresponding to the first current, the analog-to-digital converter generates a first digital potential. Corresponding to the second current, the analog-to-digital converter generates a second digital potential. Corresponding to the third current, the analog-to-digital converter generates a third digital potential. The out-of-core temperature-evaluation device subtracts the second difference between the third digital potential and the second digital potential from the first difference between the second digital potential and the first digital potential to generate a third difference. The out-of-core temperature-evaluation device evaluates the temperature data according to the third difference and the value N.

In another exemplary embodiment, the temperature sensing system includes a first circuit trace, a second circuit trace and a third circuit trace. The first circuit trace transfers the plurality of currents to the in-core temperature sensing component. The second circuit trace is coupled to a first terminal of the in-core temperature sensing component. The third circuit trace is coupled to the second terminal of the in-core temperature sensing component. The plurality of potentials generated by the in-core temperature sensing component corresponding to the plurality of currents are transferred to the out-of-core temperature-evaluation device through the second circuit trace and the third circuit trace. The out-of-core temperature-evaluation device includes an analog-to-digital converter, coupled to the second circuit trace and the third circuit trace to receive the plurality of potentials and convert the plurality of potentials from analogue to digital.

In an exemplary embodiment using three circuit traces to connect the in-core temperature sensing component and the out-of-core temperature-evaluation device, the out-of-core temperature-evaluation device provides a first current and a second current to the in-core temperature sensing component in the time-sharing manner. The second current is N times of the first current, where N is a value greater than 1. Corresponding to the first current, the analog-to-digital converter generates a first digital potential and a second digital potential. Corresponding to the second current, the analog-to-digital converter generates a third digital potential and a fourth digital potential. The out-of-core temperature-evaluation device subtracts the first difference between the first digital potential and the second digital potential from the second difference between the third digital potential and the fourth digital potential to generate a third difference. The out-of-core temperature-evaluation device evaluates the temperature data based on the third difference and the value N.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments of carrying out the invention. This description is made for the purpose of illustrating the general principles of the invention and should not be taken in a limiting sense. The scope of the invention is best determined by reference to the appended claims.

Figure 1:
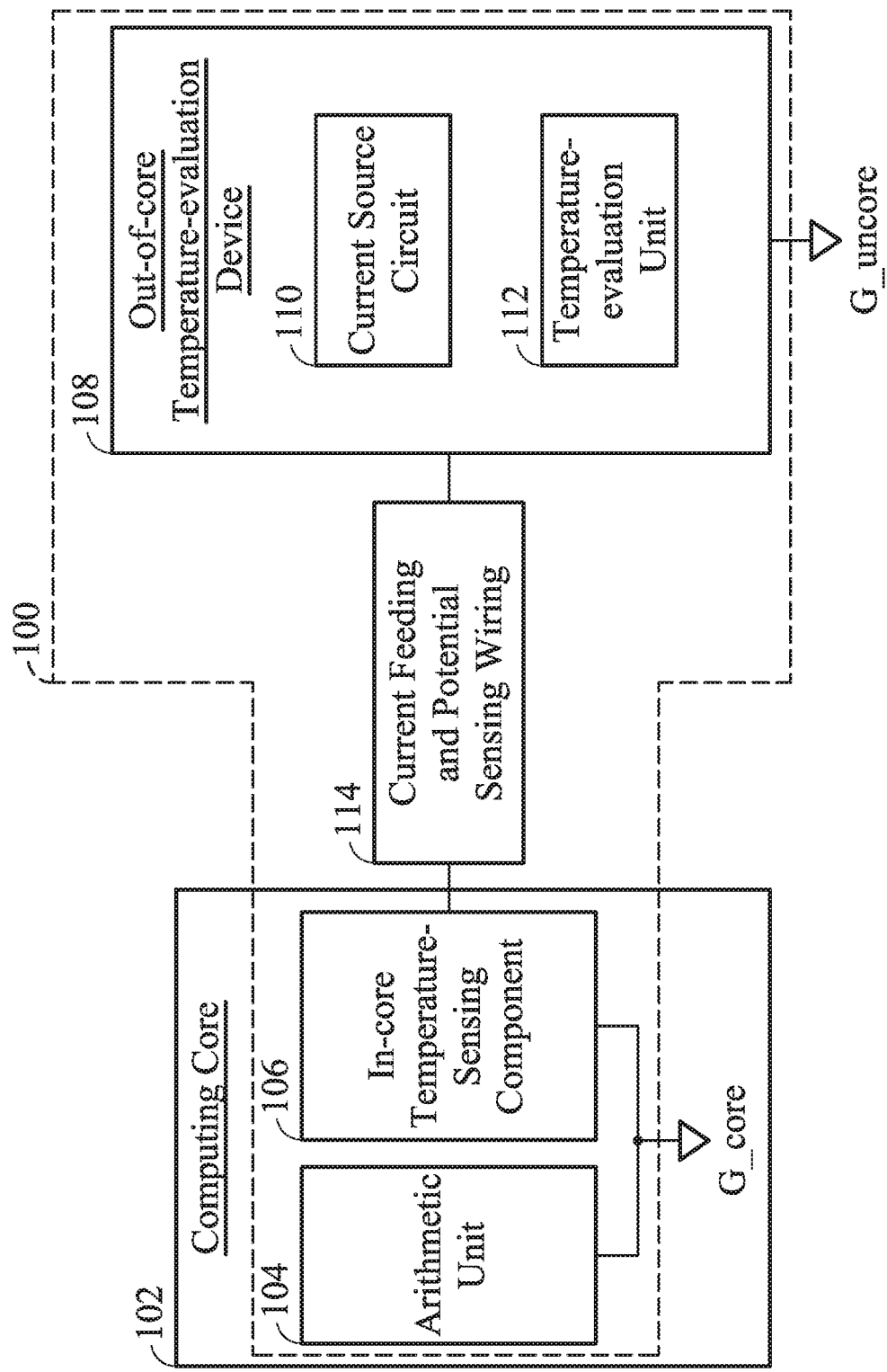
FIG. 1 is a schematic diagram of a temperature sensing system 100 in accordance with an exemplary embodiment of the present invention.

FIG. 1 is a schematic diagram of a temperature sensing system 100 in accordance with an exemplary embodiment of the present invention. The temperature sensing system 100 includes an arithmetic unit 104, an in-core temperature sensing component 106, an out-of-core temperature-evaluation device 108, and a current feeding and potential sensing wiring 114. The temperature sensing system 100 senses the temperature of a computing core 102. The arithmetic unit 104 and the in-core temperature sensing component 106 are configured within the computing core 102. The in-core temperature sensing component 106 and the arithmetic unit 104 are grounded to an in-core ground G_core. The out-of-core temperature-evaluation device 108 is responsible for obtaining potentials from the in-core temperature sensing component 106. The out-of-core temperature-evaluation device 108 includes a current source circuit 110 and a potential difference calculation and temperature-evaluation unit 112, herein the current source circuit 110 is used to generate a plurality of currents. The out-of-core temperature-evaluation device 108 is grounded to an out-of-core ground G_uncore, herein the out-of-core ground G_uncore is different from the in-core ground G_core. The out-of-core temperature-evaluation device 108 and the in-core temperature sensing component 106 are connected to each other through the current feeding and potential sensing wiring 114. The current feeding and potential sensing wiring 114 does not nothing to ground the in-core temperature sensing component 106. The currents generated by the current source circuit 110 are fed to the in-core temperature sensing component 106 through the current feeding and potential sensing wiring 114 and then grounded to the in-core ground G_core. The computing core 102 and the out-of-core temperature-evaluation device 108 may be configured in the same chip or in different chips.

In addition to transferring the plurality of currents supplied in a time sharing manner by the current source circuit 110 to the in-core temperature sensing component 106, the current feeding and potential sensing wiring 114 transfers the potentials sensed from the in-core temperature sensing component 106 to the out-of-core temperature-evaluation device 108, herein the potentials are generated according to the plurality of currents by the in-core temperature sensing component 106. The potential difference calculation and temperature-evaluation unit 112 performs a difference calculation on the potentials to evaluate temperature data. The current feeding and potential sensing wiring 114 comprises at least one circuit trace. The following lists various circuit implementation details.

Figure 2:
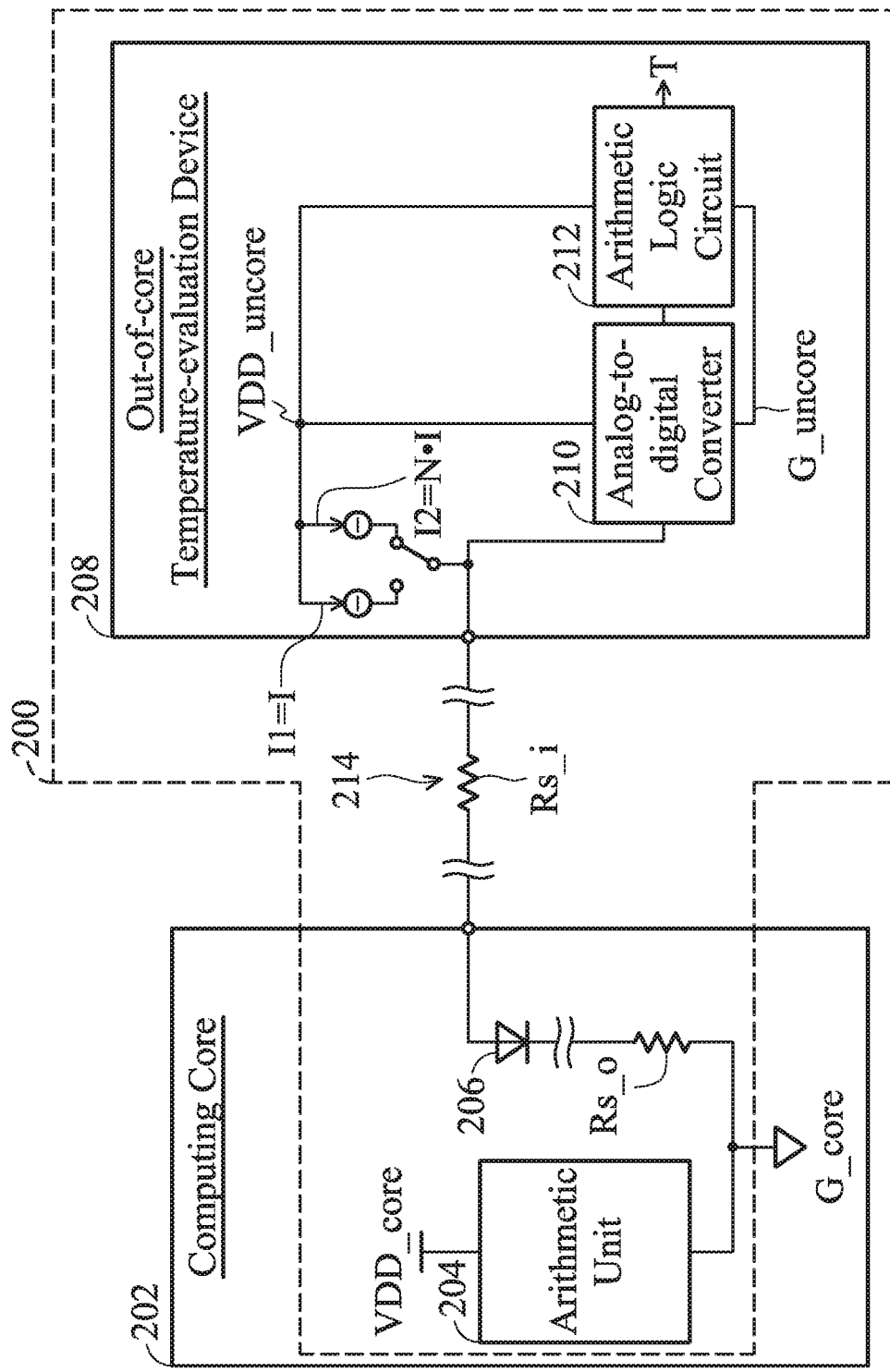
FIG. 2 is a schematic diagram of a temperature sensing system 200 in accordance with an exemplary embodiment of the present invention.

FIG. 2 is a schematic diagram of a temperature sensing system 200 in accordance with an exemplary embodiment of the present invention. The temperature sensing system 200 uses a circuit trace 214 as the current feeding and potential sensing wiring, to perform a current feeding and a potential sensing operation. The arithmetic unit 204 of the computing core 202 is powered by the in-core power supply VDD_core and is grounded to an in-core ground G_core. In this exemplary embodiment, a diode is applied to realize the in-core temperature sensing component 206, hereinafter referred as the diode 206. The diode 206 receives currents supplied by an out-of-core temperature-evaluation device 208 and is grounded to the in-core ground G_core. In particular, the diode 206 is connected to the out-of-core temperature-evaluation device 208 by just one single circuit trace 214.

Referring to the current flowing through the diode 206, the trace resistance of the current path includes trace resistance Rs_i and Rs_o. The out-of-core temperature-evaluation device 208 supplies two currents I1 (=I) and I2 (=N·I) to the diode 206 through the circuit trace 214 in a time-sharing manner (e.g., alternately). The out-of-core temperature-evaluation device 208 further includes an analog-to-digital converter 210 and an arithmetic logic circuit 212. The analog-to-digital converter 210 and the arithmetic logic circuit 212 are powered by the out-of-core power supply VDD_uncore and the out-of-core ground G_uncore. The analog-to-digital converter 210 is coupled to the circuit trace 214 to receive a sensed potential and converts the sensed potential from an analog format to a digital format. Corresponding to the currents I1 (=I) and I2 (=N·I) supplied in the time sharing manner, the analog-to-digital converter 210 generates two digital potentials V1 and V2. The arithmetic logic circuit 212 evaluates temperature data T based on a number N and a difference (V2−V1) between the two digital potentials V1 and V2, herein the number N is a value greater than 1. The potential difference ΔVg between the in-core ground G_core and the out-of-core ground G_uncore is eliminated in the temperature evaluation.

The example of FIG. 2 configures two current sources for the current source circuit to provide currents I1 (=I) and I2 (=N·I). In another exemplary embodiment, to make the current I2 (=N·I) accurate, out-of-core temperature-evaluation device 208 may include several identical current sources. Each of the identical current sources provides the same current I. The current I1 (=I) and the current I2 (=N·I) are generated through a dynamic element-matching technique. In an exemplary embodiment, the identical current sources are randomly selected and combined to provide the currents I and N·I and thereby the confliction of mismatch between different current sources is alleviated.

In an exemplary embodiment, corresponding to the in-core temperature sensing component implemented by the diode 206, the arithmetic logic circuit 212 evaluates the temperature data T by a quantized value of a anode-cathode potential difference ΔVbe. Generally speaking, the diode 206 is implemented by a PNP triode, the emitter of the PNP triode is taken as the anode of the diode 206, the connected base and collector of the PNP triode is taken as the cathode of the diode 206. The arithmetic logic circuit 212 evaluates the temperature data T using the following formula:

$$V_2 - V_1 = (Vbe_2 + I_2 \cdot R_s + \Delta V_g) - (Vbe_1 + I_1 \cdot R_s + \Delta V_g)$$
$$= (Vbe_2 - Vbe_1) + (I_2 - I_1) \cdot R_S$$
$$= \Delta Vbe_{2-1} + (N-1) \cdot I_1 \cdot R_S$$
$$= (N_f) \cdot \frac{KT}{q} \cdot \text{Ln}(N) + (N-1) \cdot I_1 \cdot R_S$$

Wherein, Vbe1 is a voltage drop of the diode 206 when the current I1 flows through the diode 206. Vbe2 is a voltage drop of the diode 206 when the current I2 flows through the diode 206. The parasitic series resistance $R_S$ is the sum of the trace resistances RS_i and Rs_o. ΔVg is the potential difference between the in-core ground G_core and the out-of-core ground G_uncore. q is the charge on an electron. Nf is an ideal factor close to 1. K is the Boltzman's constant. N is the ratio of current I2 to current I1. Generally, if the influence of the parasitic series resistance RS is ignored, the temperature data T can be expressed as follows:

$$T \approx \frac{(V_2 - V_1) \cdot q}{(N_f) \cdot K \cdot \text{Ln}(N)}$$

However, in actual engineering applications, due to the limited accuracy of the current source circuit and the limited resolution of the analog-to-digital converter, the influence of the parasitic series resistance $R_S$ cannot be ignored. The parasitic series resistance $R_S$ will result in a temperature error $T_{ERROR}$ to the temperature data T expressed in the forgoing temperature. The temperature error $T_{ERROR}$ can be expressed as:

$$T_{ERROR} = \frac{(N-1) \cdot I_1 \cdot R_S}{\left(\frac{\partial \Delta Vbe_{2-1}}{\partial T}\right)} = \frac{(N-1) \cdot I_1 \cdot R_S}{Nf \cdot \left(\frac{K}{q}\right) \cdot \text{Ln}(N)}$$

In an exemplary embodiment wherein the current I1 is 25 uA and N is 8, the temperature error $T_{ERROR}$ can be expressed as:

$$T_{ERROR} \approx 0.9757 \cdot R_S$$

It can be seen that the longer the circuit trace 214 is, the greater the parasitic series resistance $R_s$ is, and the greater the temperature error $T_{ERROR}$ is.

Figure 3:
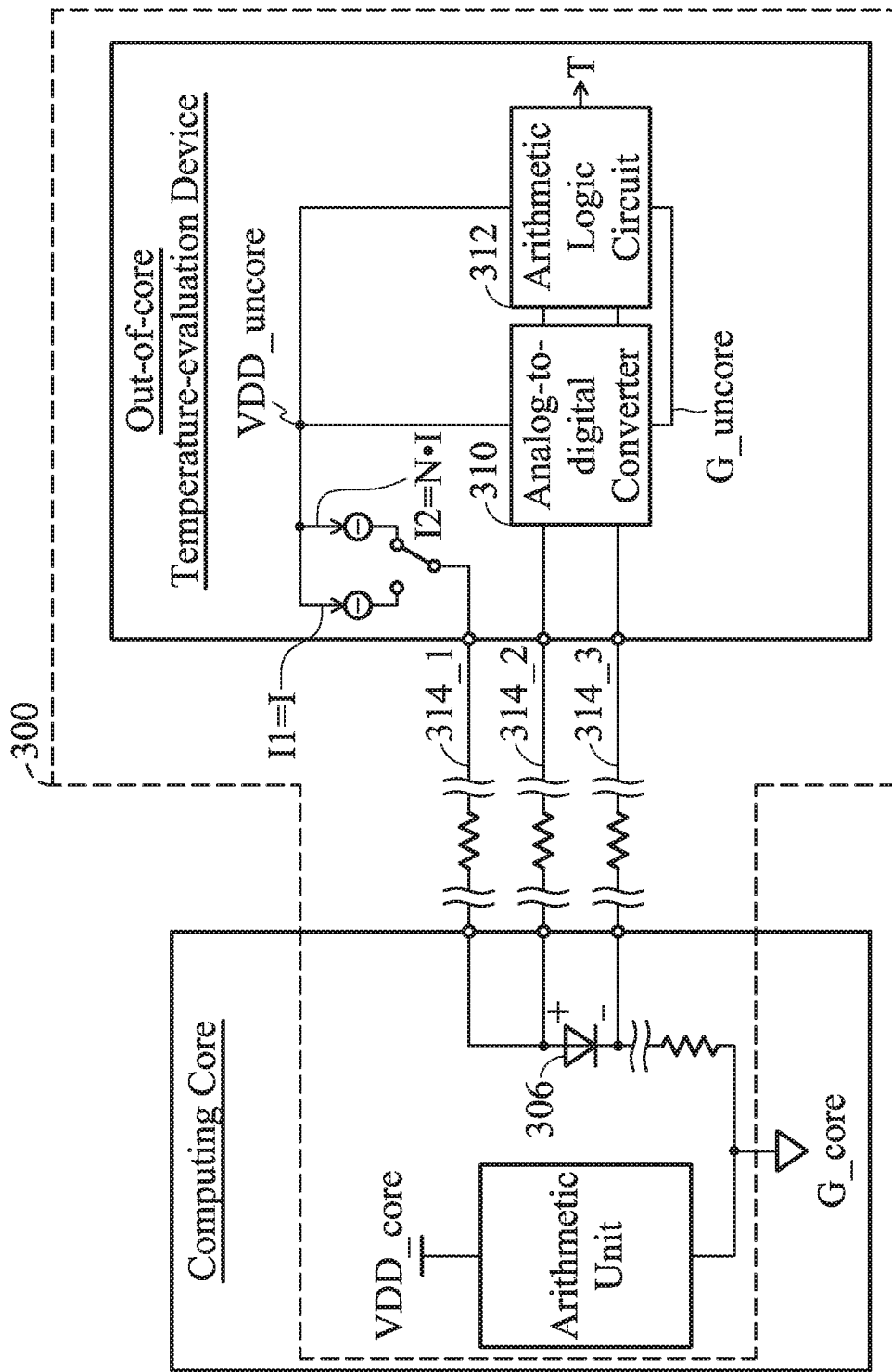
FIG. 3 is a schematic diagram of a temperature sensing system 300 in accordance with an exemplary embodiment of the present invention.

FIG. 3 is a schematic diagram of a temperature sensing system 300 in accordance with an exemplary embodiment of the present invention. The temperature sensing system 300 separates the current path and the potential sensing path of a diode 306. The current feeding and potential sensing wiring of the temperature sensing system 300 includes three circuit traces 314_1, 314_2, and 314_3. The circuit trace 314_1 transfers the currents I1 (=I) and I2 (=N·I) into the diode 306 in a time-sharing manner (e.g., alternately). The circuit trace 314_2 and the third circuit trace 314_3 are respectively connected to an anode "+" and an cathode "−" of the diode 306. The analog-to-digital converter 310 is coupled to the circuit trace 314_2 and the third circuit trace 314_3. Corresponding to the current I1 (=I), the analog-to-digital converter 310 performs an analog-to-digital conversion to evaluate an anode digital potential VP1 and a cathode digital potential VN1. Corresponding to the current I2 (=N·I), the analog-to-digital converter 310 performs an analog-to-digital conversion to evaluate an anode digital potential VP2 and a cathode digital potential VN2. The arithmetic logic circuit 312 calculates a difference value (VP2−VN2)−(VP1−VN1) according to the difference between VP1 and VN1 and the difference between VP2 and VN2. The temperature data T is evaluated based on the current ratio N and the difference value (VP2−VN2)−(VP1−VN1), wherein both the potential difference ΔVg between the in-core ground G_core and the out-of-core ground G_uncore and the temperature error $T_{ERROR}$ due to the parasitic series resistance Rs are eliminated in the calculation. The input port of the analog-to-digital converter 310 is configured to be at a high impedance state, so the voltage drop (IR drop) of the circuit traces 314_2 and 314_3 can be regarded as zero, and thereby the temperature error $T_{ERROR}$ will not be affected.

Referring to the in-core temperature sensing component implemented by the diode 306, the arithmetic logic circuit 312 evaluates the temperature data T based on a quantized anode-cathode potential difference ΔVbe. Generally speaking, the diode 306 is implemented by a PNP triode, the emitter of the PNP triode is taken as the anode of the diode 306, the connected base and collector of the PNP triode is taken as the cathode of the diode 306. The temperature data T may be derived as follows.

Because $$\Delta V_{2-1} = (VP_2 - VN_2) - (VP_1 - VN_1)$$
$$= Vbe_2 - Vbe_1 = (N_f) \cdot \frac{KT}{q} \cdot \text{Ln}(N)$$
$$\therefore T = \frac{[(VP_2 - VN_2) - (VP_1 - VN_1)] \cdot q}{(N_f) \cdot K \cdot \text{Ln}(N)}$$

In addition, the current source circuit shown in FIG. 3 used to generate the currents I1 (=I) and I2 (=N·I) may be changed to a plurality of identical current sources instead. Each of the plurality of identical current sources generates the same current I, in order to generate the current I1 (=I) and current I2 (=N·I) through the dynamic element-matching technique.

However, the three circuit traces 314_1, 314_2, and 314_3 will increase the wiring complexity, and result in a delay in the potential sampling of the cathode and anode of the diode 306.

Figure 4:
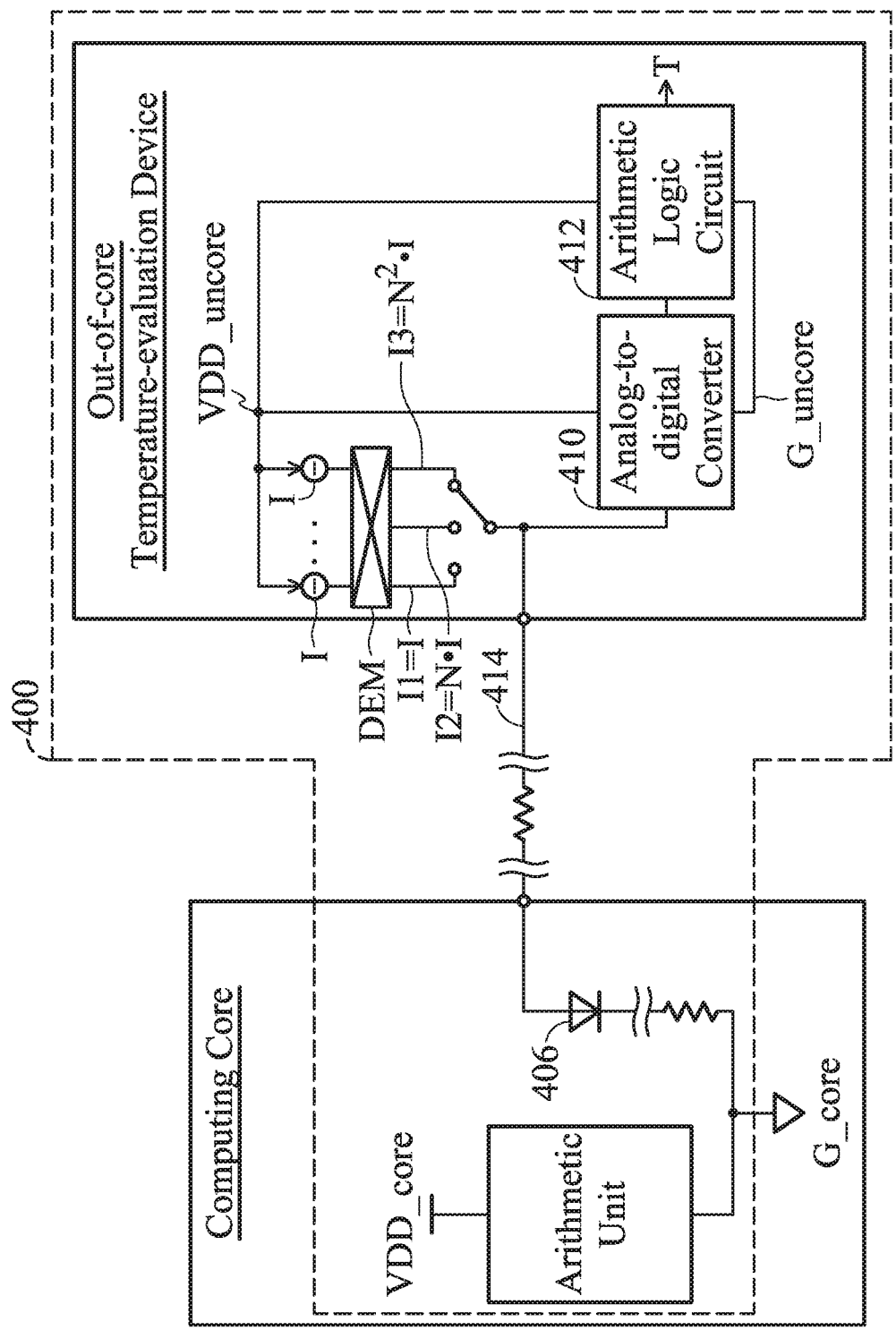
FIG. 4 is a schematic diagram of a temperature sensing system 400 in accordance with another embodiment of the present invention.

FIG. 4 is a schematic diagram of a temperature sensing system 400 in accordance with another embodiment of the present invention. The temperature sensing system 400 includes just a single circuit trace 414, the single circuit trace 414 is also capable of eliminating the temperature error $T_{ERROR}$. Different from the temperature sensing system 200, three currents I1(=I), I2 (=N·I) and I3 (=N²·I) are fed to the diode 406 in a time-sharing manner. Output signals of several identical current sources are combined by a dynamic element-matching device DEM to generate the three currents I1(=I), I2 (=N·I) and I3 (=N²·I). Each of the identical current sources provides the same current I. The analog-to-digital converter 410 is coupled to the circuit trace 414. Corresponding to the three different currents I1 (=I), I2 (=N·I) and I3 (=N²·I) supplied in the time-sharing manner, the analog-to-digital converter 410 generates digital potentials V1, V2 and V3. The arithmetic logic circuit 412 calculates a difference value (V2−V1)−(V3−V2) according to the difference (V2−V1) between potentials V2 and V1 and the difference (V3−V2) between potentials V3 and V2, and then evaluates the temperature data T by combining the difference value (V2−V1)−(V3−V2) with the current ratio N. The evaluated temperature data T is irrelevant to the potential difference ΔVg between the in-core ground G_core and the out-of-core ground G_uncore, and the temperature error $T_{ERROR}$ is irrelevant to the parasitic series resistance $R_S$.

Corresponding to the in-core temperature sensing component implemented by the diode 406, the arithmetic logic circuit 412 evaluates the temperature data T by a quantized difference ΔVbe between anode-cathode potential differences. Generally speaking, the diode 406 is implemented by a PNP triode, the emitter of the PNP triode is taken as the anode of the diode 406, the connected base and collector of the PNP triode is taken as the cathode of the diode 406. The arithmetic logic circuit 412 evaluates the temperature data T using the following formula:

$$\Delta V_{2-1} = V_2 - V_1$$
$$= (Vbe_2 + I_2 \cdot R_s + \Delta V_g) - (Vbe_1 + I_1 \cdot R_s + \Delta V_g)$$
$$= (Vbe_2 - Vbe_1) + (I_2 - I_1) \cdot R_S$$
$$= (N_f) \cdot \frac{KT}{q} \cdot \text{Ln}(N) + (N-1) \cdot I_1 \cdot R_S$$

$$\Delta V_{3-2} = V_3 - V_2 = (Vbe_3 + I_3 \cdot R_s + \Delta V_g) - (Vbe_2 + I_2 \cdot R_s + \Delta V_g)$$
$$= (Vbe_3 - Vbe_2) + (I_3 - I_2) \cdot R_S$$
$$= (N_f) \cdot \frac{KT}{q} \cdot \text{Ln}(N) + (N-1) \cdot N \cdot I_1 \cdot R_S$$

$$\Delta V_{3-2} - \Delta V_{2-1} = (V_3 - V_2) - (V_2 - V_1) = (N-1)^2 \cdot I_1 \cdot R_S$$

$$\therefore R_S = \frac{(V_3 - V_2) - (V_2 - V_1)}{(N-1)^2 \cdot I_1}$$

$$\Delta V_{3-1} = V_3 - V_1 = (Vbe_3 + I_3 \cdot R_s + \Delta V_g) - (Vbe_1 + I_1 \cdot R_s + \Delta V_g)$$
$$= (Vbe_3 - Vbe_1) + (I_3 - I_1) \cdot R_S$$

$$\therefore Vbe_3 - Vbe_1 = V_3 - V_1 - (I_3 - I_1) \cdot R_S$$
$$= V_3 - V_1 - (N^2 - 1) \cdot I_1 \cdot R_S$$
$$= V_3 - V_1 - [(V_3 - V_2) - (V_2 - V_1)] \cdot \frac{N+1}{N-1}$$
$$= \frac{2N \cdot (V_2 - V_1) - 2 \cdot (V_3 - V_2)}{N-1}$$
$$= (N_f) \cdot \frac{KT}{q} \cdot \text{Ln}(N^2)$$

Wherein, Vbe1 is a voltage drop generated by the diode 406 when the current I1 flows through the forward-biased diode 406. Vbe2 is a voltage drop generated by the diode 406 when the current I2 flows through the forward-biased diode 406. Vbe3 is a voltage drop generated by the diode 406 when the current I3 flows through the forward-biased diode 406. The parasitic series resistance $R_S$ is equal to the sum of the trace resistances RS_i and Rs_o. ΔVg is the voltage difference between the in-core ground G_core and the out-of-core ground G_uncore. q is the charge of an electron. Nf is an ideal factor close to 1. K is the Boltzman's constant. N is the current ratio of current I2 to current I1. According to the forgoing expressions, the temperature data T is:

$$T = \left[\frac{N \cdot (V_2 - V_1) - (V_3 - V_2)}{N-1}\right] \cdot \frac{q}{(N_f) \cdot K \cdot \text{Ln}(N)}$$

If N is 2, the temperature data T evaluated by the arithmetic logic circuit 412 is:

$$T = \frac{(3V_2 - 2V_1 - V_3) \cdot q}{(N_f) \cdot K \cdot \text{Ln}(2)}$$

The aforementioned temperature data T evaluation performed by the arithmetic logic circuit 412 includes a difference calculation between a voltage drop of the diode 406 corresponding to the current I3 (=N²·I) and another voltage drop of the diode 406 corresponding to the current I1 (=I). Because of the significant difference between I3 (=N²·I) and the current I1 (=I), the precise of the analog-to-digital converter 410 is not required to be high. A low cost analog-to-digital converter 410 is good enough, which greatly reduces the manufacturing costs of a chip. And the difficulty of the calculations performed by the arithmetic logic circuit 412 did not need to increase significantly.

The various aforementioned designs all use simple circuits to realize in-core temperature sensing. A multi-core chip may configure in-core temperature sensing component(s), such as the in-core temperature sensing component 106, for at least one core, herein each n-core temperature sensing component is equipped within a core. So that, an accurate and individual temperature sensing operation can be performed to one particular core of the multi-core chip, or a part of the multiple cores of the multi-core chip, or all of the multiple cores of the multi-core chip.

The in-core temperature sensing component 106 is not limited to be implemented by a diode, and may also be a triode, a temperature-sensitive resistor, or others.

In an exemplary embodiment, the pins of the computing core 102 and the out-of-core interpretation device 108 are connected by simple circuit trace(s). The in-core temperature sensing component 106 is fabricated within the hardware module of the computing core 102.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A temperature sensing system, comprising:
    an in-core temperature sensing component, including a diode that receives a plurality of currents alternately, and generating a plurality of potentials according to the plurality of currents alternately directed into the same diode, wherein the in-core temperature sensing component outputs the plurality of currents to an in-core ground;
    an out-of-core temperature evaluation device, coupled to the in-core temperature sensing component to provide the plurality of currents to the in-core temperature sensing component, receiving the plurality of potentials to calculate a potential difference, and evaluating a temperature data according to the potential difference, wherein the out-of-core temperature-evaluation device is grounded to an out-of-core ground; and a circuit trace, transferring the plurality of currents from the out-of-core temperature-evaluation device to the in-core temperature sensing component;

wherein:

the out-of-core temperature-evaluation device comprises an analog-to-digital converter; and the analog-to-digital converter is coupled to the circuit trace to receive the plurality of potentials generated by the in-core temperature sensing component and returned through the circuit trace, and convert the received plurality of potentials from analogue to digital for potential difference evaluation.

2. The temperature sensing system as claimed in claim 1, wherein:

the out-of-core temperature-evaluation device provides a first current and a second current to the in-core temperature sensing component alternately;

the second current is N times of the first current, wherein N is a value greater than 1;

corresponding to the first current, the analog-to-digital converter generates a first digital potential;

corresponding to the second current, the analog-to-digital converter generates a second digital potential;

the out-of-core temperature-evaluation device subtracts the second digital potential from the first digital potential to generate the potential difference; and the out-of-core temperature-evaluation device evaluates the temperature data according to the potential difference and the value N, wherein the plurality of currents comprises the first current and the second current.

3. The temperature sensing system as claimed in claim 2, wherein:

the out-of-core temperature-evaluation device comprises a plurality of identical current sources, and generates the first current and the second current through a dynamic element-matching operation.

4. The temperature sensing system as claimed in claim 1, wherein:

the out-of-core temperature-evaluation device provides a first current, a second current and a third current to the in-core temperature sensing component alternately;

the third current is N times of the second current, and the second current is N times of the first current, wherein N is a value greater than 1;

corresponding to the first current, the analog-to-digital converter generates a first digital potential;

corresponding to the second current, the analog-to-digital converter generates a second digital potential;

corresponding to the third current, the analog-to-digital converter generates a third digital potential;

the out-of-core temperature-evaluation device subtracts a second difference between the third digital potential and the second digital potential from a first difference between the second digital potential and the first digital potential to generate the potential difference; and the out-of-core temperature-evaluation device evaluates the temperature data according to the potential difference and the value N, wherein the plurality of currents comprises the first current, the second current and the third current.

5. The temperature sensing system as claimed in claim 4, wherein the out-of-core temperature-evaluation device evaluates that the temperature data is:

$$\left[\frac{N \cdot (V2 - V1) - (V3 - V2)}{N - 1}\right] \cdot \frac{q}{(Nf) \cdot K \cdot \operatorname{Ln}(N)}$$

wherein V1, V2, and V3 are the first digital potential, the second digital potential and the third digital potential respectively, q is the charge of an electron, Nf is an ideal factor close to 1, and K is the Boltzman's constant.

6. The temperature sensing system as claimed in claim 4, wherein:

the out-of-core temperature-evaluation device includes a plurality of identical current sources, and generates the first current, the second current and the third current through a dynamic element-matching operation.

7. A temperature sensing system, comprising:

an in-core temperature sensing component, including a diode that receives a plurality of currents alternately, and generating a plurality of potentials according to the plurality of currents alternately directed into the same diode, wherein the in-core temperature sensing component outputs the plurality of currents to an in-core ground;

an out-of-core temperature evaluation device, coupled to the in-core temperature sensing component to provide the plurality of currents to the in-core temperature sensing component, receiving the plurality of potentials to calculate a potential difference, and evaluating a temperature data according to the potential difference, wherein the out-of-core temperature-evaluation device is grounded to an out-of-core ground; and a first circuit trace transferring the plurality of currents to the in-core temperature sensing component, a second circuit trace, coupled to a first terminal of the diode, and a third circuit trace coupled to a second terminal of the diode, wherein, corresponding to the plurality of currents, the second circuit trace and the third circuit trace provide the plurality of potentials to the out-of-core temperature-evaluation device;

wherein:

the out-of-core temperature-evaluation device comprises an analog-to-digital converter; and the analog-to-digital converter is coupled to the second circuit trace and the third circuit trace to receive the plurality of potentials generated by the in-core temperature sensing component and returned through the second circuit trace and the third circuit trace, and convert the received plurality of potentials from analogue to digital for potential difference evaluation.

8. The temperature sensing system as claimed in claim 7, wherein:

the out-of-core temperature-evaluation device provides a first current and a second current to the in-core temperature sensing component alternately;

the second current is N times of the first current, wherein N is a value greater than 1;

corresponding to the first current, the analog-to-digital converter generates a first digital potential and a second digital potential;

corresponding to the second current, the analog-to-digital converter generates a third digital potential and a fourth digital potential;

the out-of-core temperature-evaluation device subtracts a first difference between the first digital potential and the second digital potential from a second difference between the third digital potential and the fourth digital potential to generate the potential difference; and the out-of-core temperature-evaluation device evaluates the temperature data according to the potential difference and the value N, wherein the plurality of currents comprises the first current and the second current.

9. The temperature sensing system as claimed in claim 8, wherein the out-of-core temperature-evaluation device evaluates that the temperature data is:

$$\frac{[(VP2 - VN2) - (VP1 - VN1)] \cdot q}{(Nf) \cdot K \cdot \mathrm{Ln}(N)}$$

wherein VP1 and VP2 are the first digital potential and the third digital potential respectively, VN1 and VN2 are the second digital potential and the fourth digital potential respectively, q is the charge of an electron, Nf is an ideal factor close to 1, and K is the Boltzman's constant.

10. The temperature sensing system as claimed in claim 8, wherein:

the out-of-core temperature-evaluation device includes a plurality of identical current sources, and generates the first current and the second current through a dynamic element-matching operation.

* * * * *